United States Patent
Shi et al.

(10) Patent No.: US 8,138,577 B2
(45) Date of Patent: Mar. 20, 2012

(54) PULSE-LASER BONDING METHOD FOR THROUGH-SILICON-VIA BASED STACKING OF ELECTRONIC COMPONENTS

(75) Inventors: Xunqing Shi, Singapore (SG); Wei Ma, Tseung Kwan O (HK); Bin Xie, Fanling Centre (HK); Chang Hwa Chung, Shatin (HK)

(73) Assignee: Hong Kong Applied Science and Technology Research Institute Co., Ltd., Shatin, New Territories (HK)

( * ) Notice: Subject to any disclaimer, the term of this patent is extended or adjusted under 35 U.S.C. 154(b) by 438 days.

(21) Appl. No.: 12/057,241

(22) Filed: Mar. 27, 2008

(65) Prior Publication Data
US 2009/0243046 A1 Oct. 1, 2009

(51) Int. Cl.
*H01L 23/538* (2006.01)
*H01L 21/44* (2006.01)

(52) U.S. Cl. ......... 257/621; 257/E23.169; 257/E23.174; 438/667

(58) Field of Classification Search .................. 257/621, 257/E23.174; 438/667
See application file for complete search history.

(56) References Cited

U.S. PATENT DOCUMENTS

| | | | |
|---|---|---|---|
| 6,271,056 B1 * | 8/2001 | Farnworth et al. | 438/106 |
| 6,424,048 B1 | 7/2002 | Umetsu et al. | |
| 6,577,013 B1 | 6/2003 | Glenn et al. | |
| 6,593,645 B2 | 7/2003 | Shih et al. | |
| 6,677,237 B2 | 1/2004 | Umetsu et al. | |
| 6,703,310 B2 * | 3/2004 | Mashino et al. | 438/666 |
| 7,157,787 B2 | 1/2007 | Kim et al. | |
| 7,344,959 B1 | 3/2008 | Pogge et al. | |
| 7,361,593 B2 * | 4/2008 | Freeman et al. | 438/675 |
| 7,459,393 B2 * | 12/2008 | Farnworth et al. | 438/667 |
| 7,491,582 B2 * | 2/2009 | Yokoyama et al. | 438/109 |
| 2002/0151169 A1 | 10/2002 | Umetsu et al. | |
| 2004/0222512 A1 | 11/2004 | Coomer | |
| 2005/0048698 A1 * | 3/2005 | Yamaguchi | 438/109 |
| 2007/0111386 A1 | 5/2007 | Kim et al. | |
| 2007/0131661 A1 * | 6/2007 | Reiber | 219/121.63 |
| 2008/0009129 A1 * | 1/2008 | Subido et al. | 438/612 |
| 2008/0029879 A1 * | 2/2008 | Tuckerman et al. | 257/704 |
| 2008/0105976 A1 | 5/2008 | Pogge et al. | |

(Continued)

FOREIGN PATENT DOCUMENTS
JP     58141880     8/1983
(Continued)

OTHER PUBLICATIONS

First Office Action for China Application No. 2008800001261; Issued Nov. 6, 2009; 4 pp. English Version; 2 pp. Chinese Version.

(Continued)

*Primary Examiner* — Angel Roman
(74) *Attorney, Agent, or Firm* — Wells St. John, P.S.

(57) ABSTRACT

There is described a method of forming a through-silicon-via to form an interconnect between two stacked semiconductor components using pulsed laser energy. A hole is formed in each component, and each hole is filled with a plug formed of a first metal. One component is then stacked on another component such that the holes are in alignment, and a pulse of laser energy is applied to form a bond between the metal plugs.

26 Claims, 16 Drawing Sheets

U.S. PATENT DOCUMENTS

2008/0239550 A1  10/2008  Nagai

FOREIGN PATENT DOCUMENTS

| JP | 2-8833 B2 | 2/1990 |
| JP | 10-223833 A | 8/1998 |
| JP | 2007-96777 A | 4/2007 |
| WO | WO 2008/030665 A1 | 3/2008 |

OTHER PUBLICATIONS

PCT/CN/2008/072293; Filed Sep. 8, 2008; Search Report mailed Dec. 8, 2008; 5 pp.

PCT/CN/2008/072293; Filed Sep. 8, 2008; Written Opinion mailed Dec. 8, 2008; 7 pp.

* cited by examiner

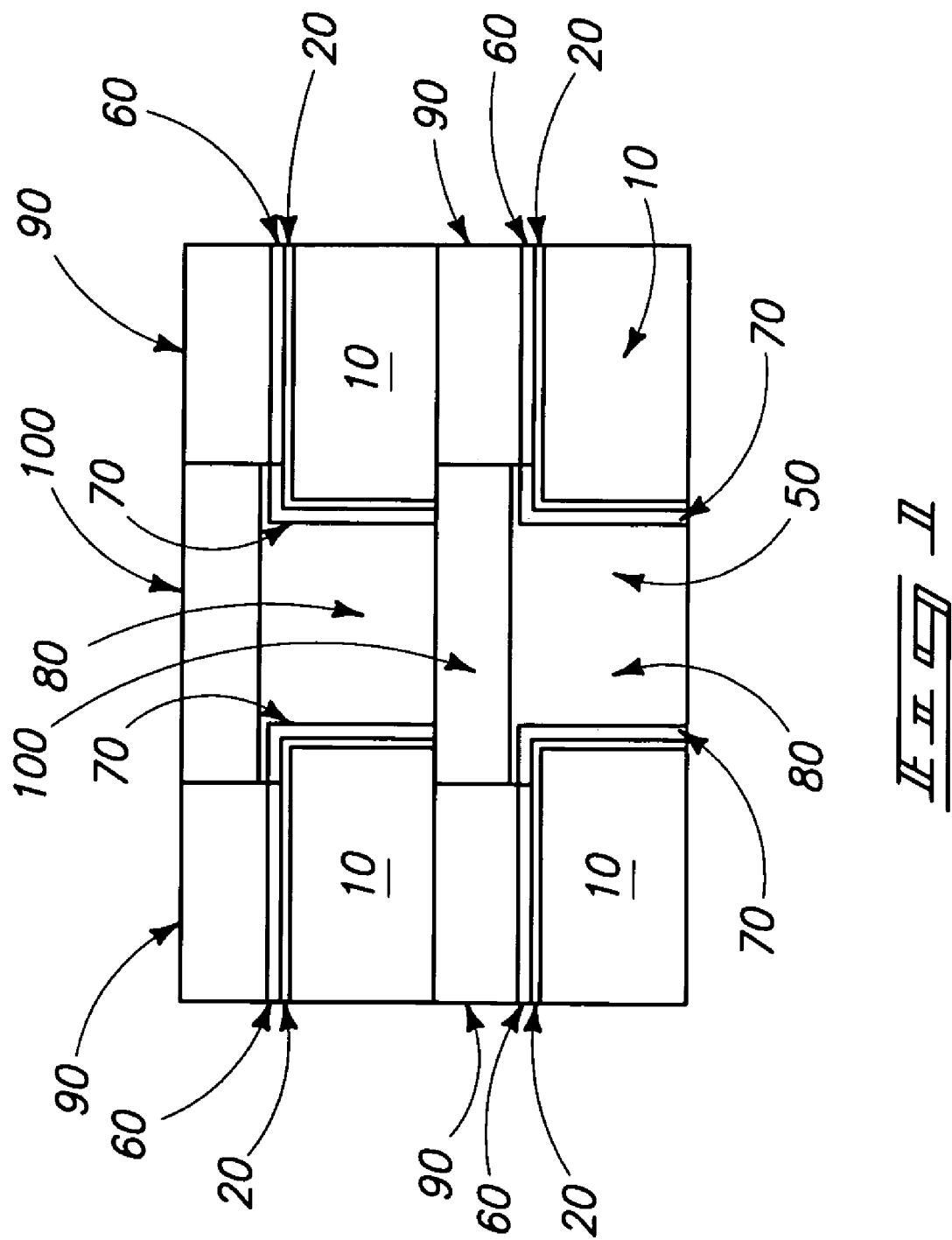

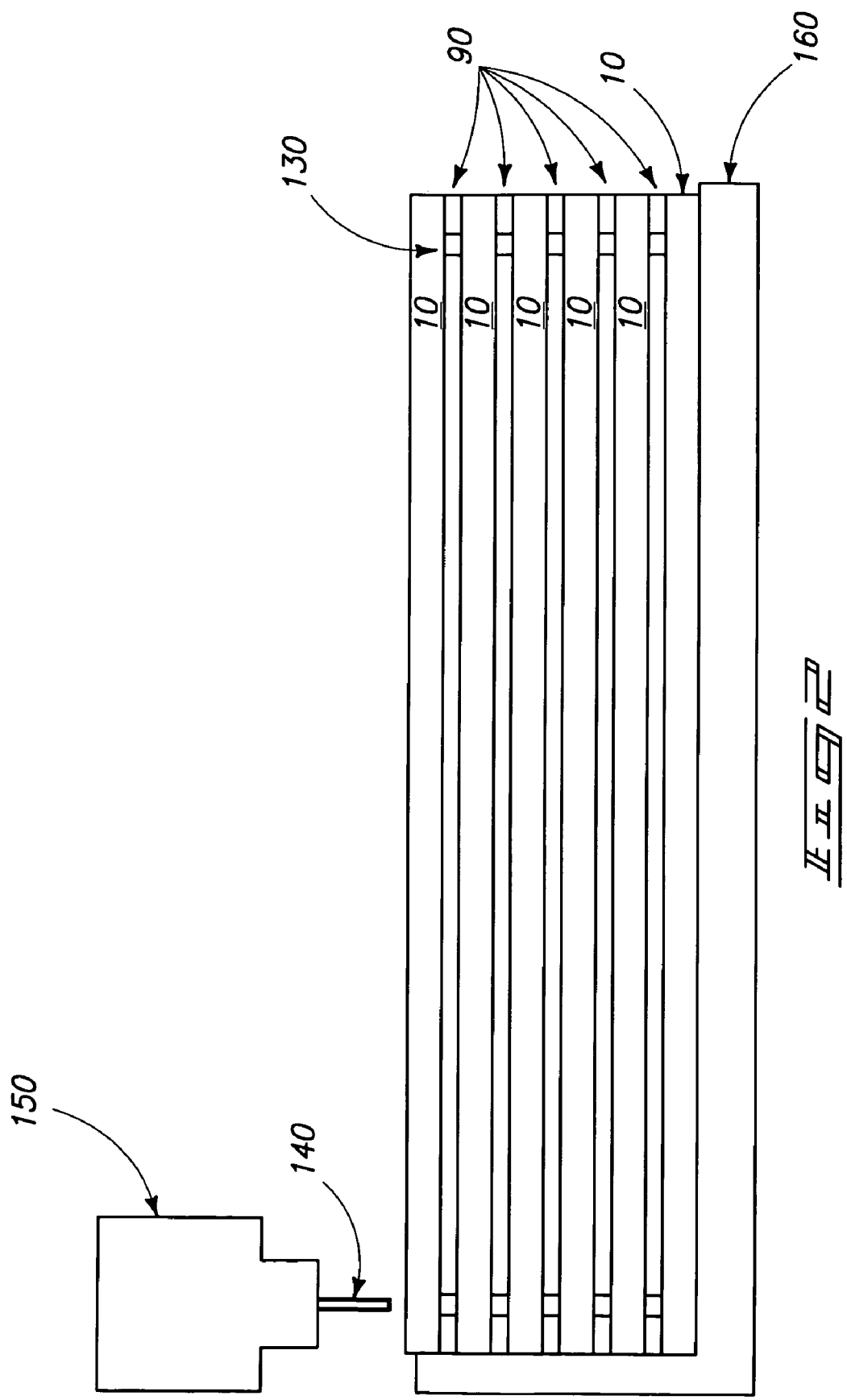

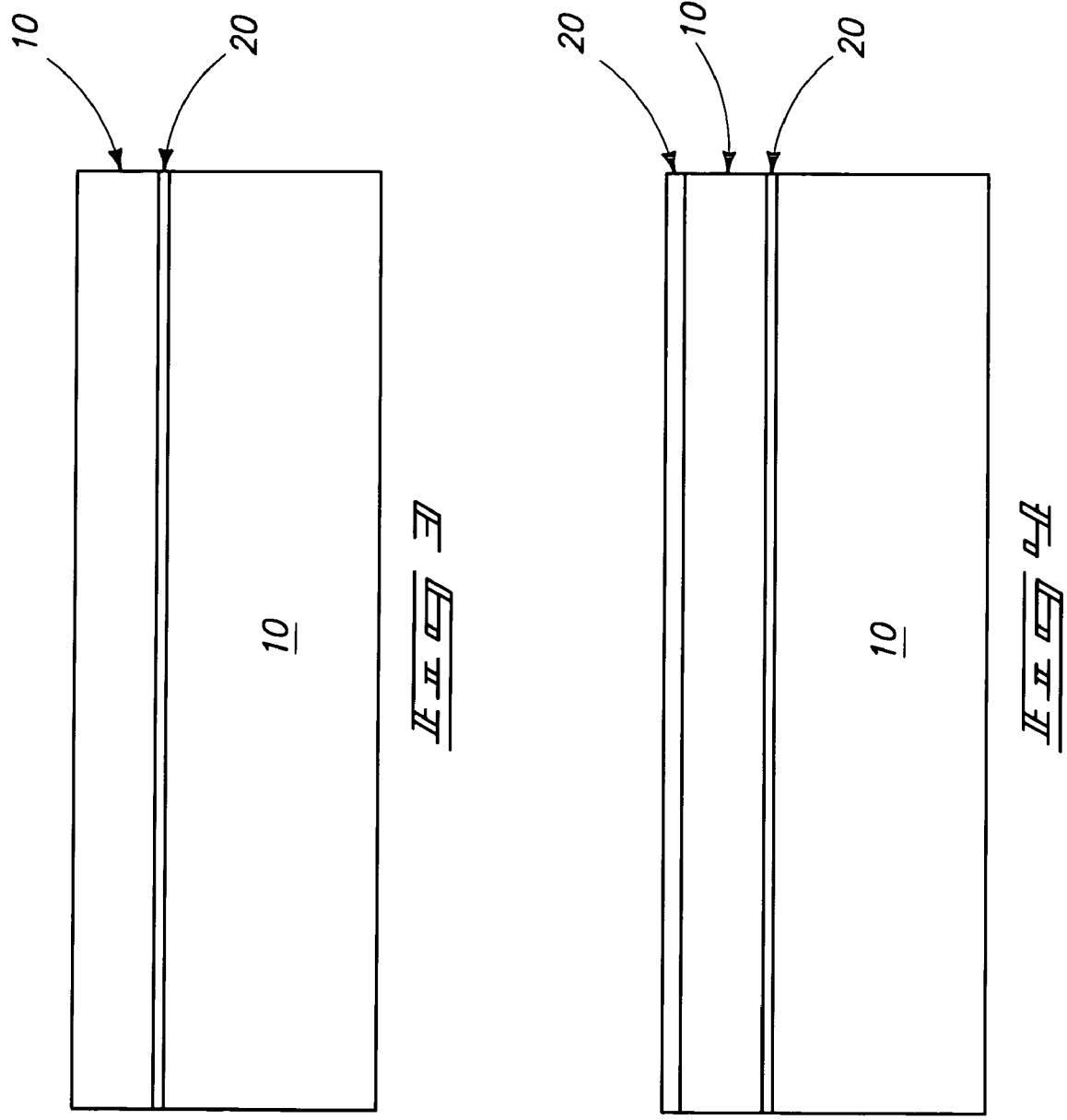

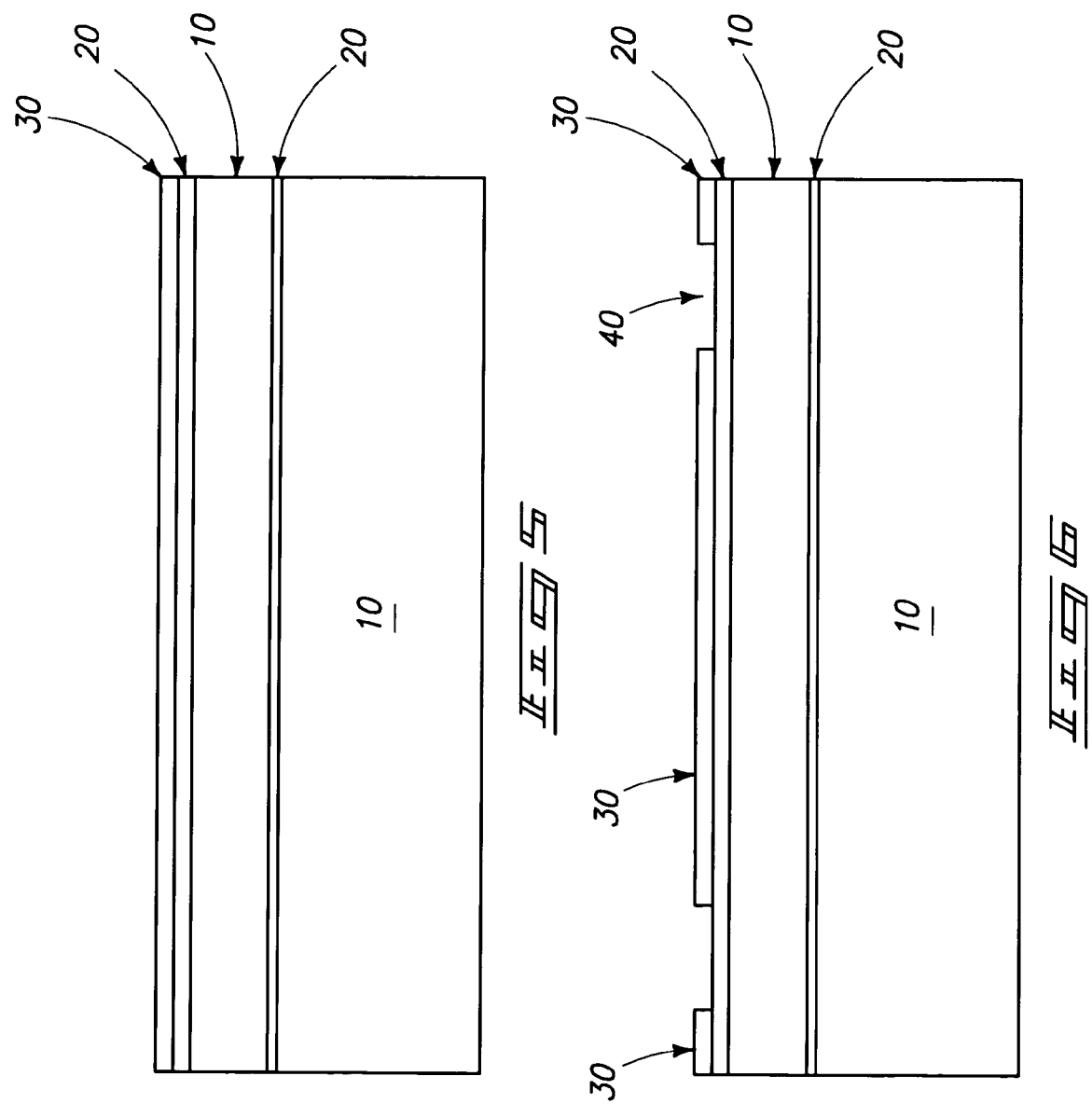

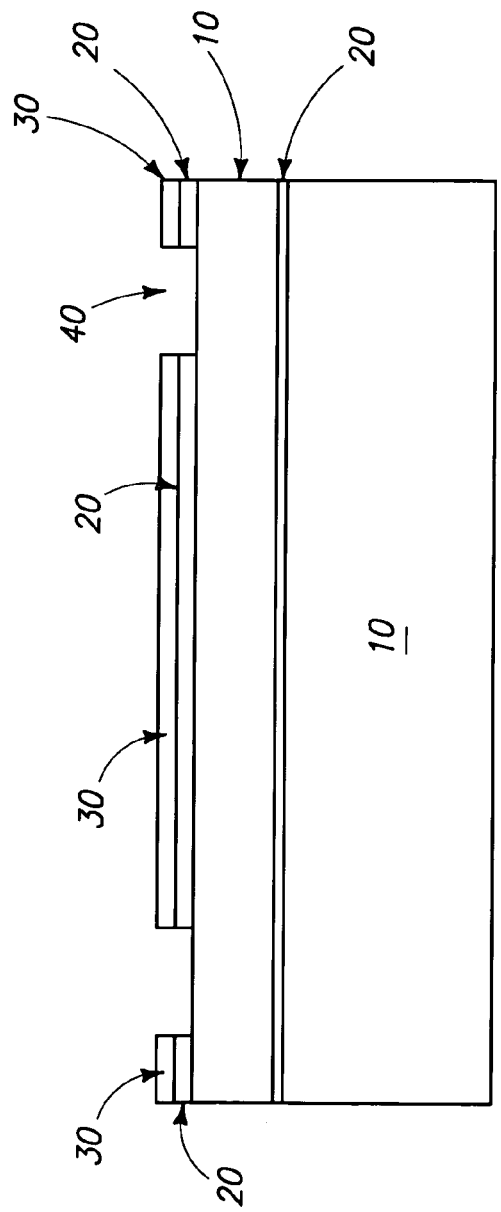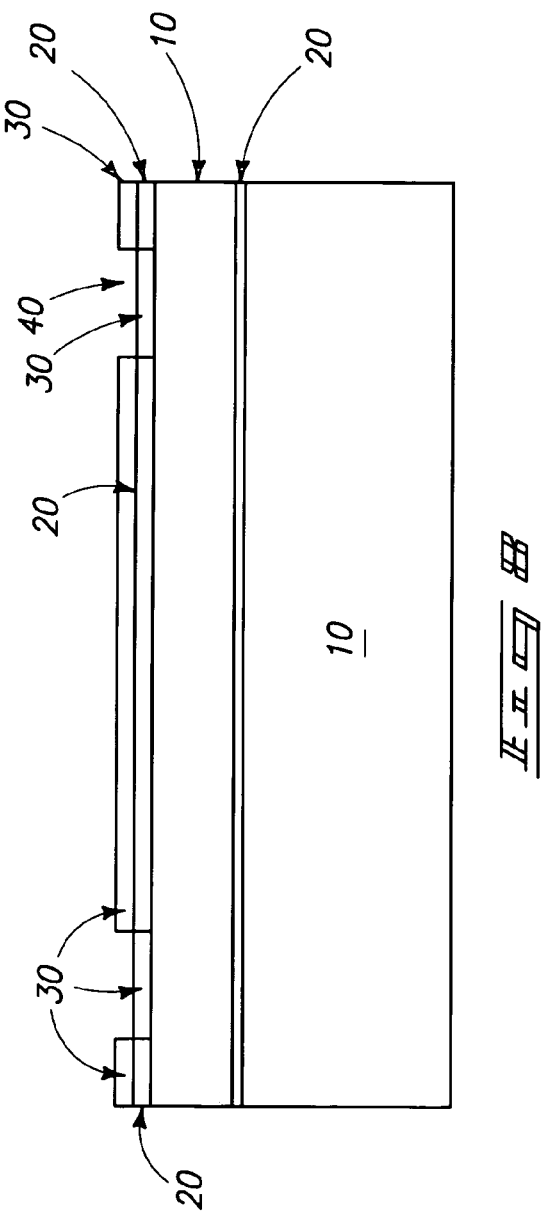

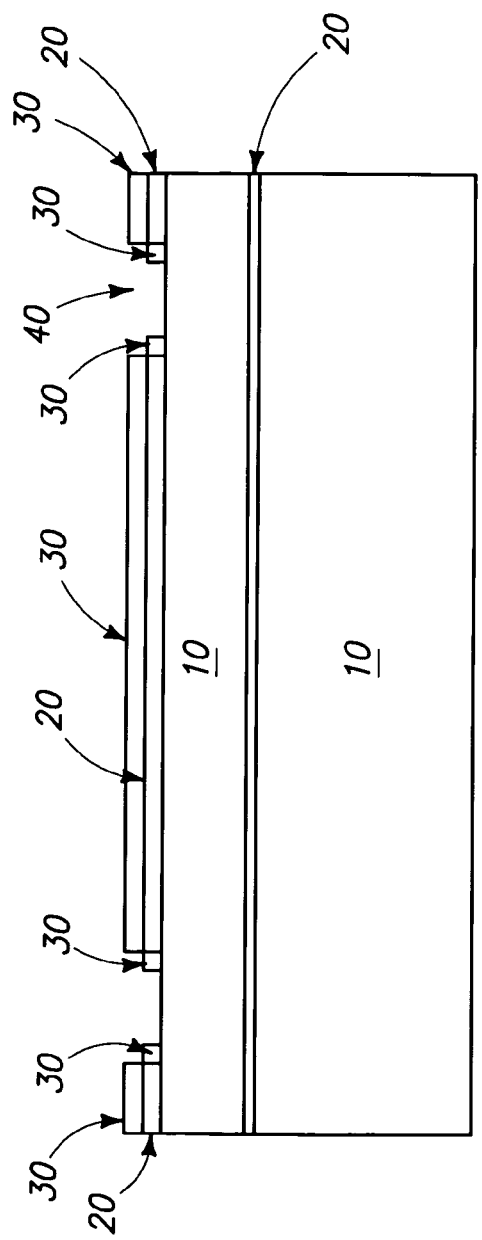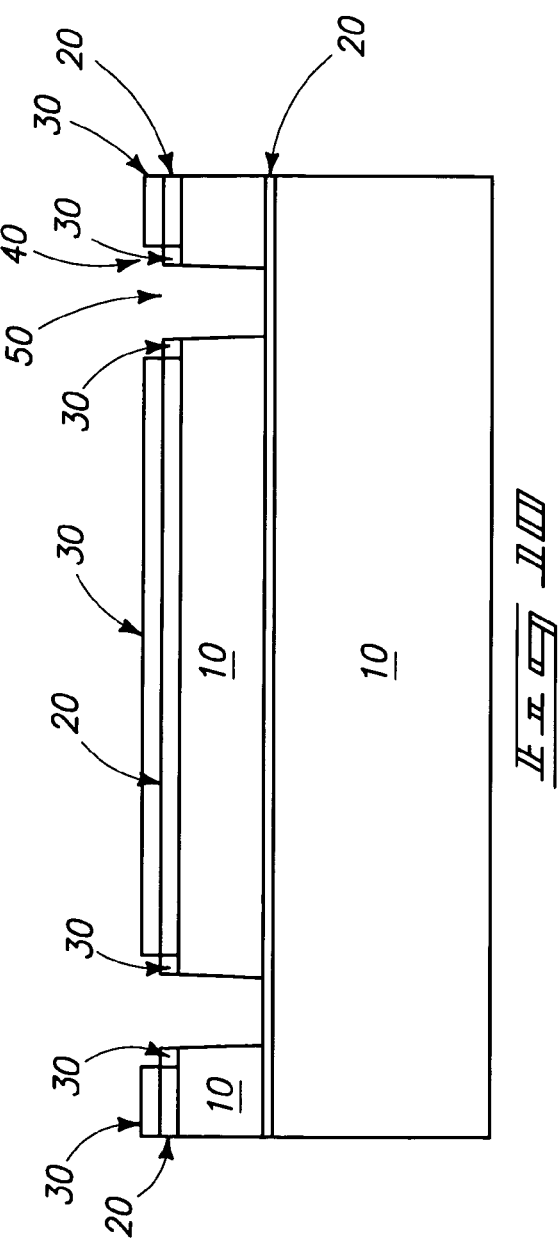

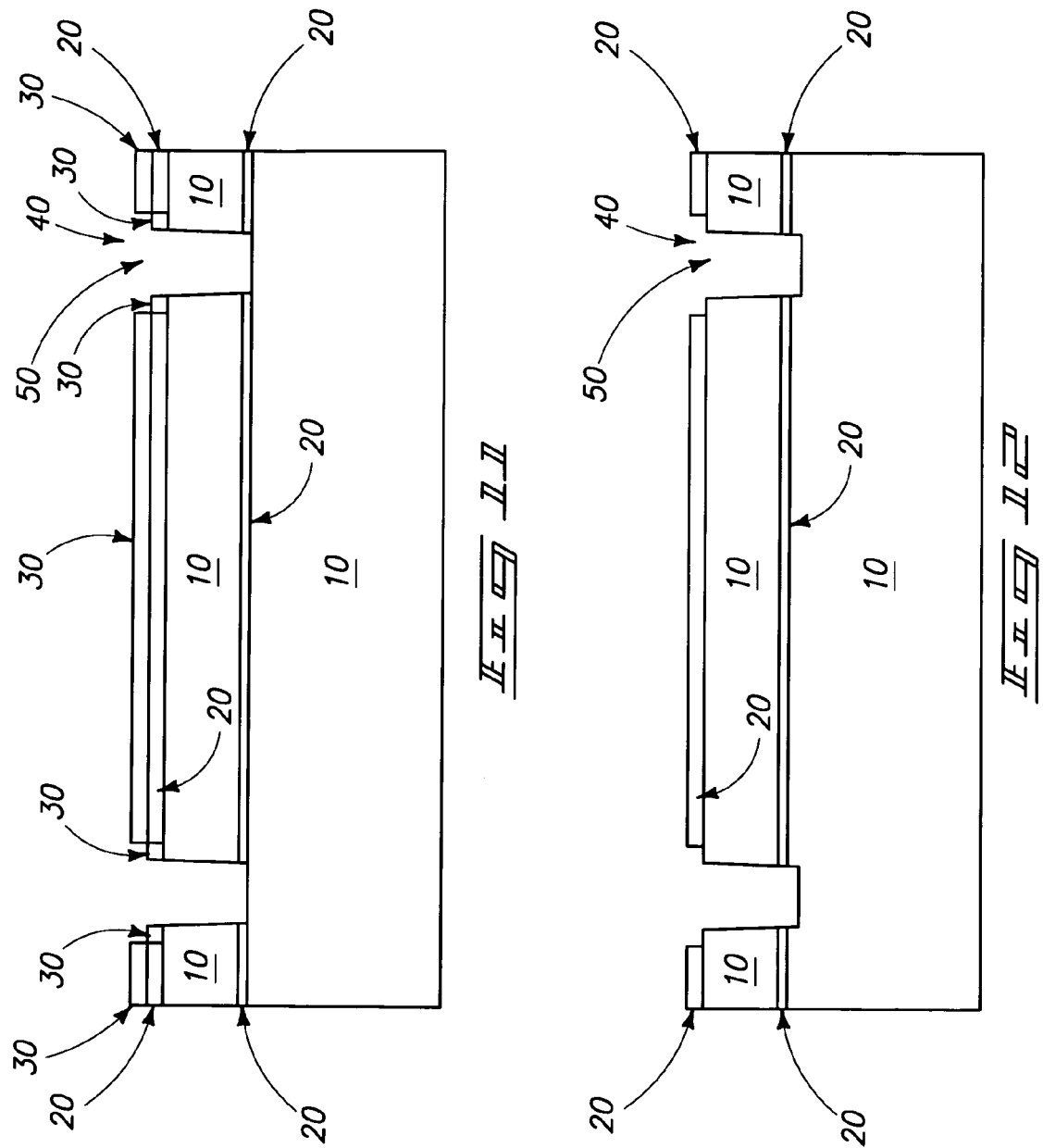

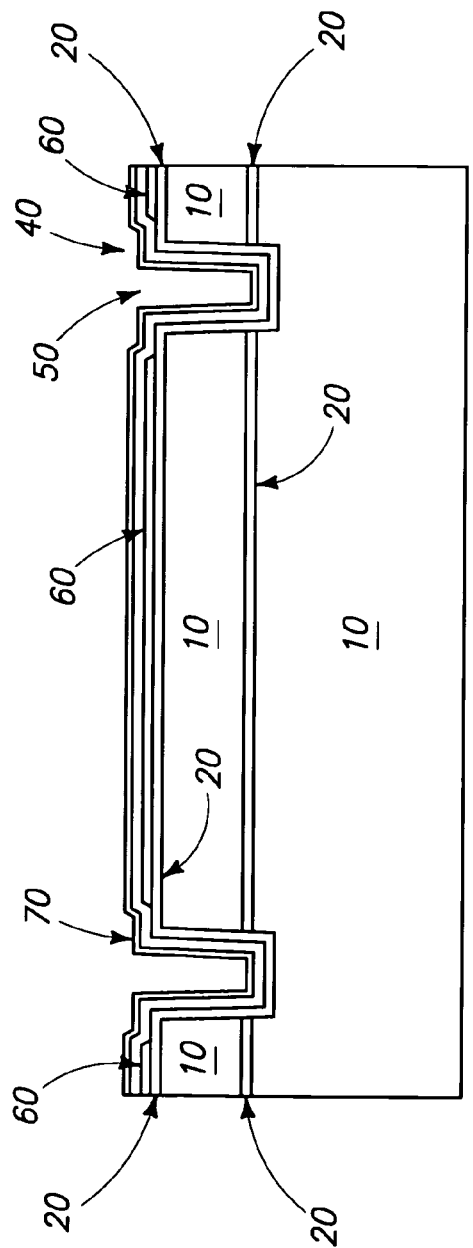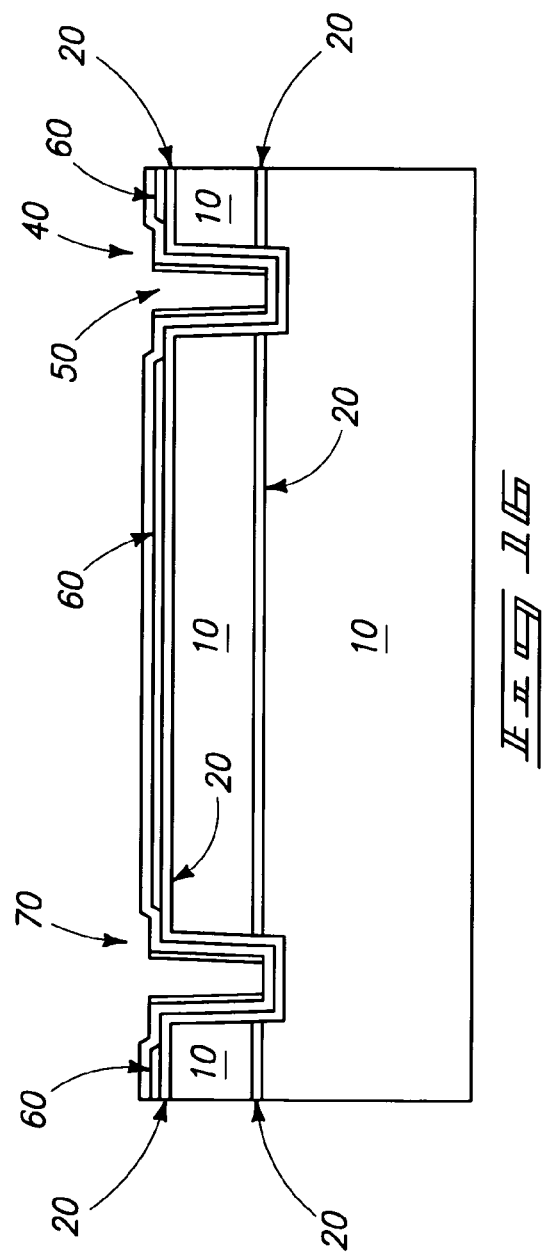

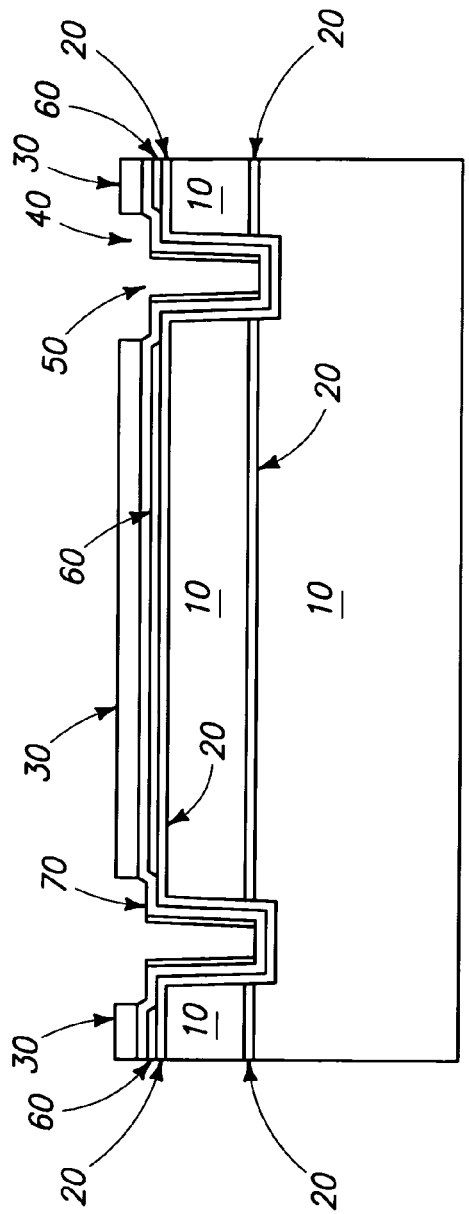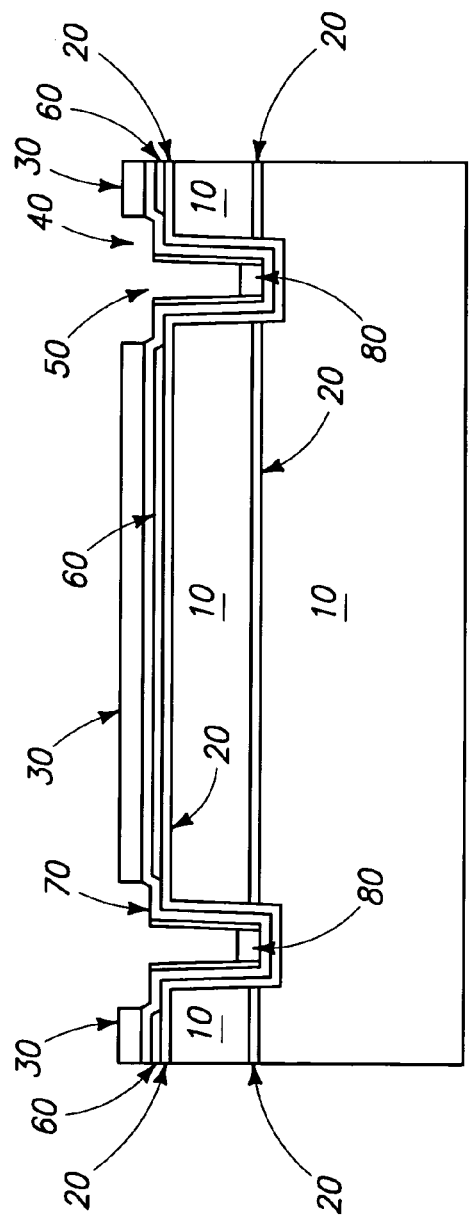

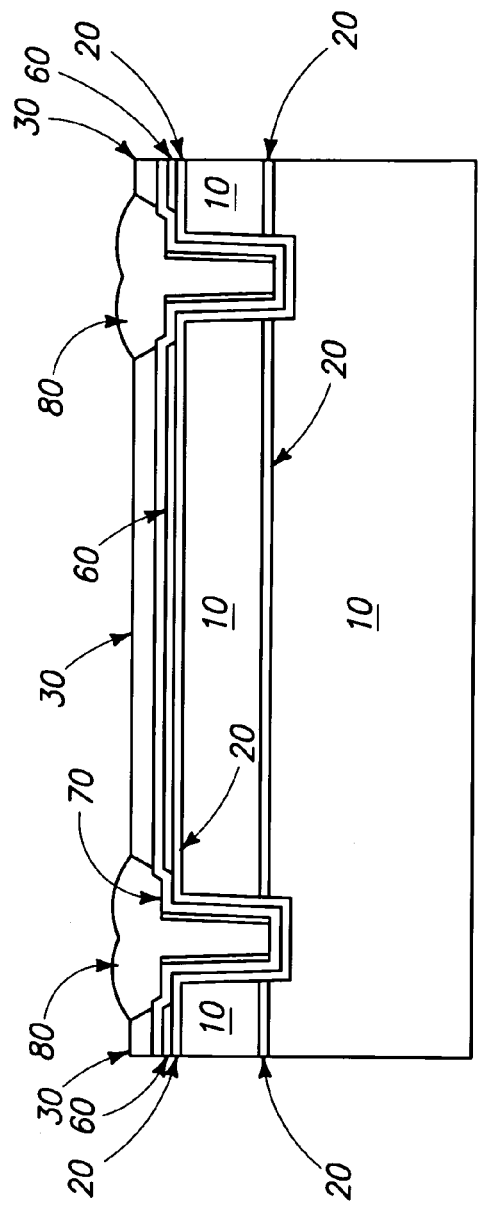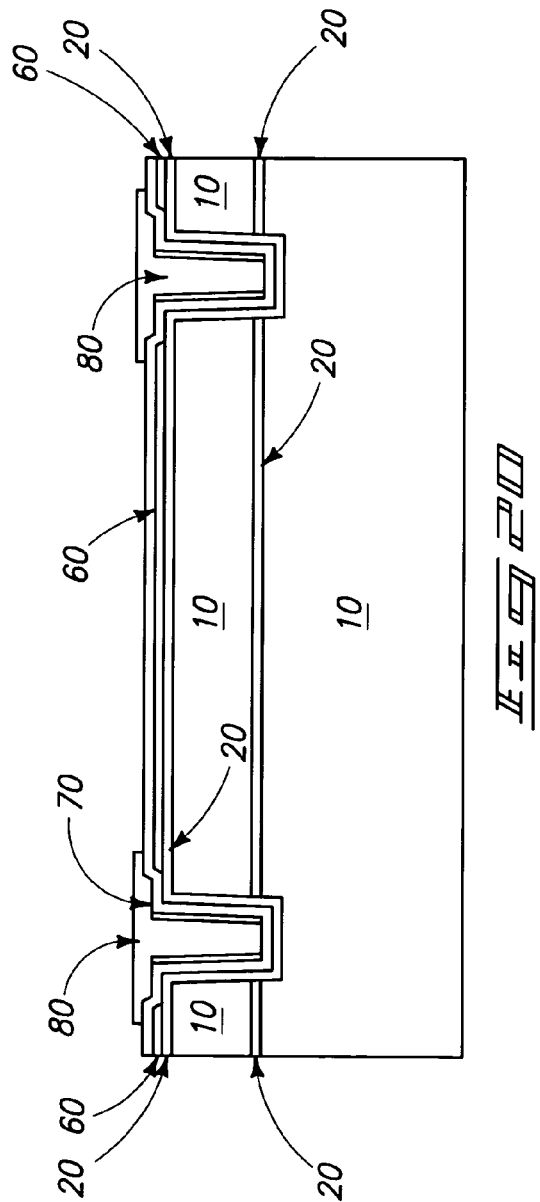

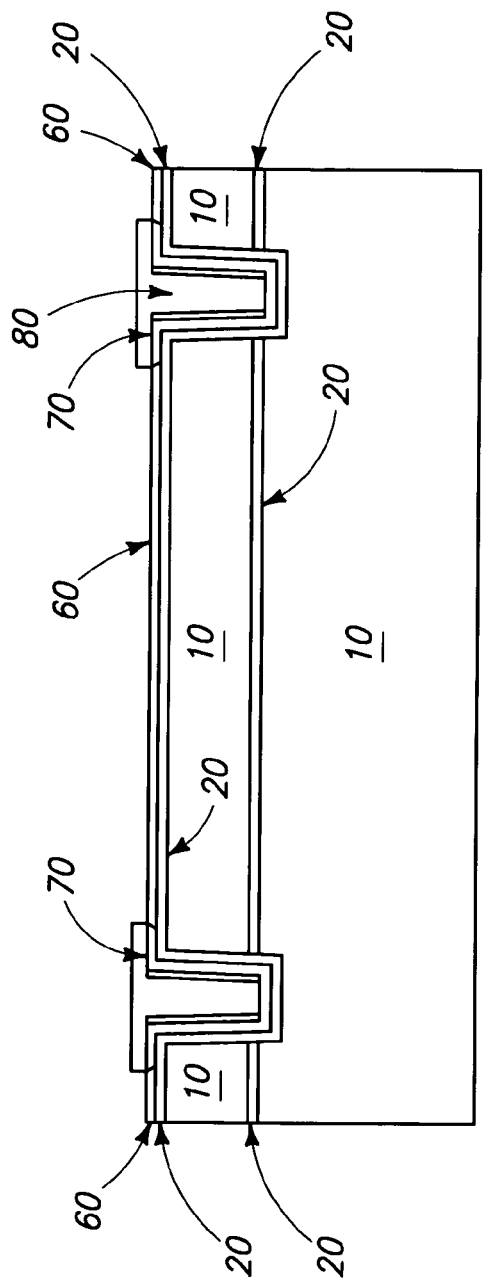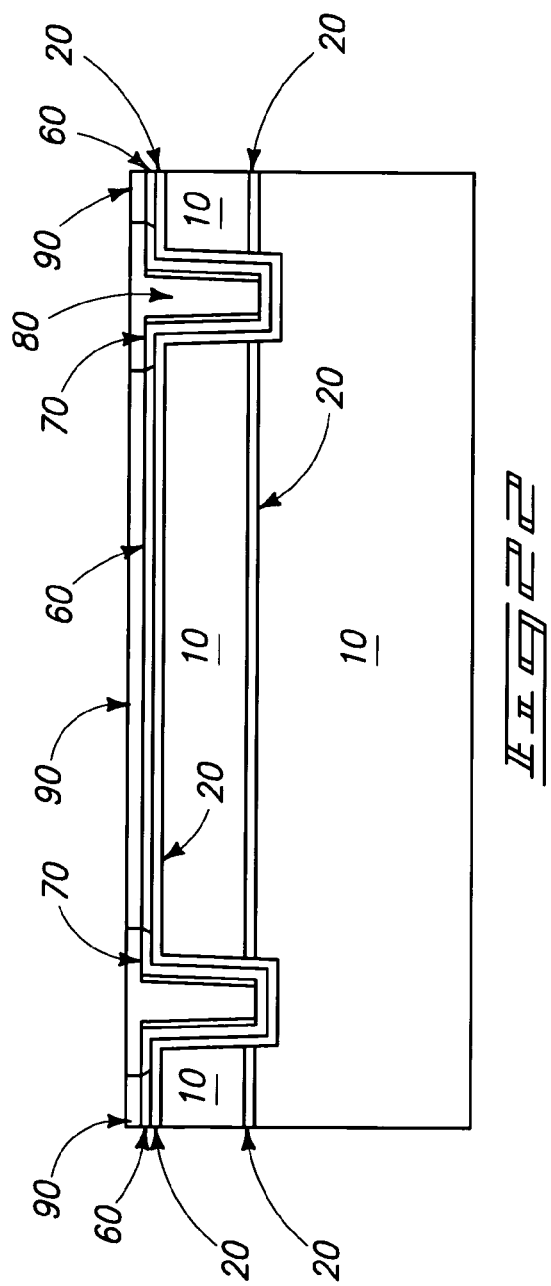

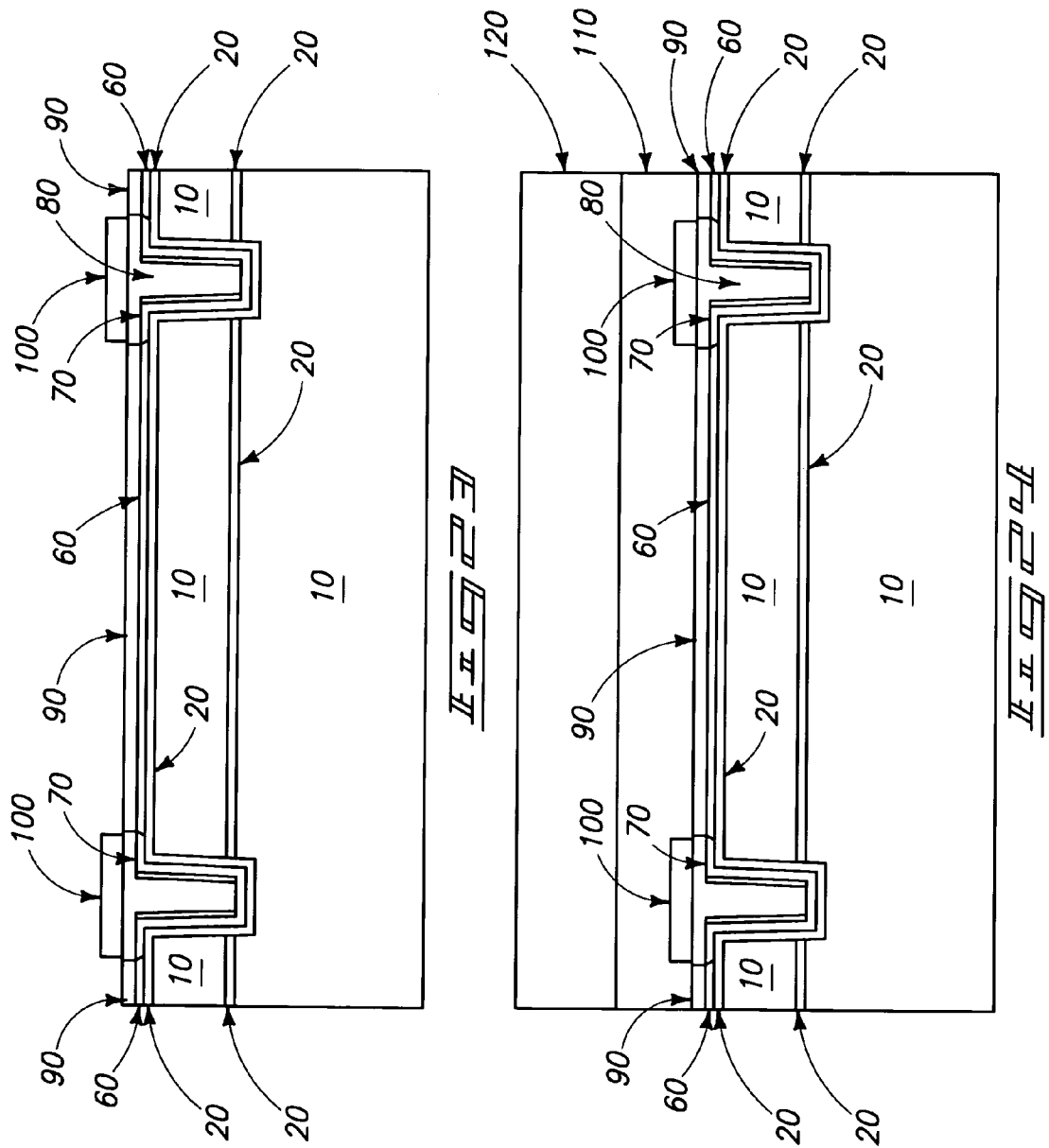

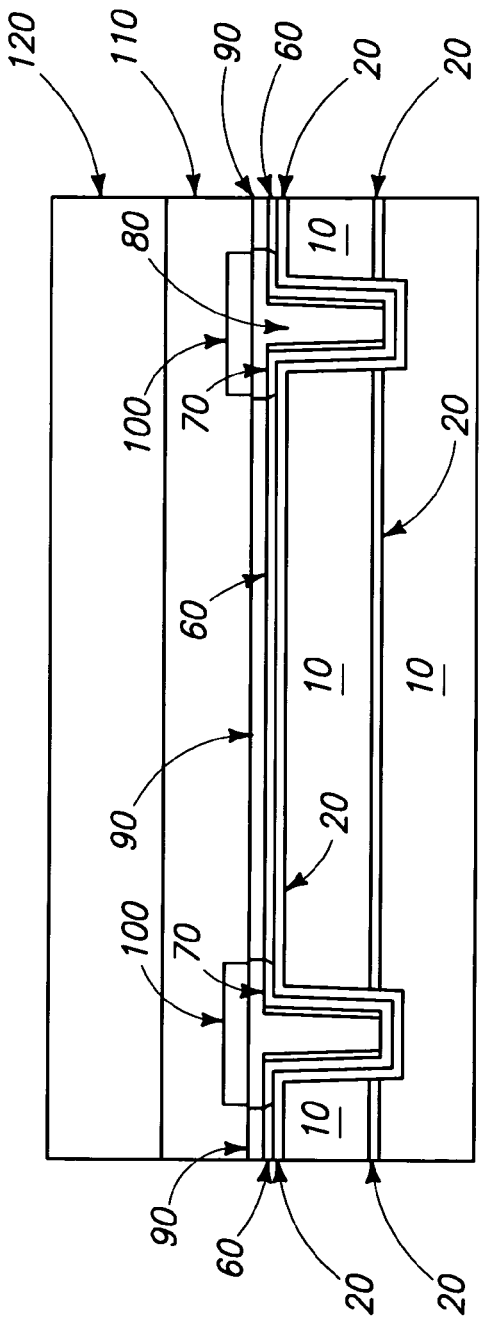
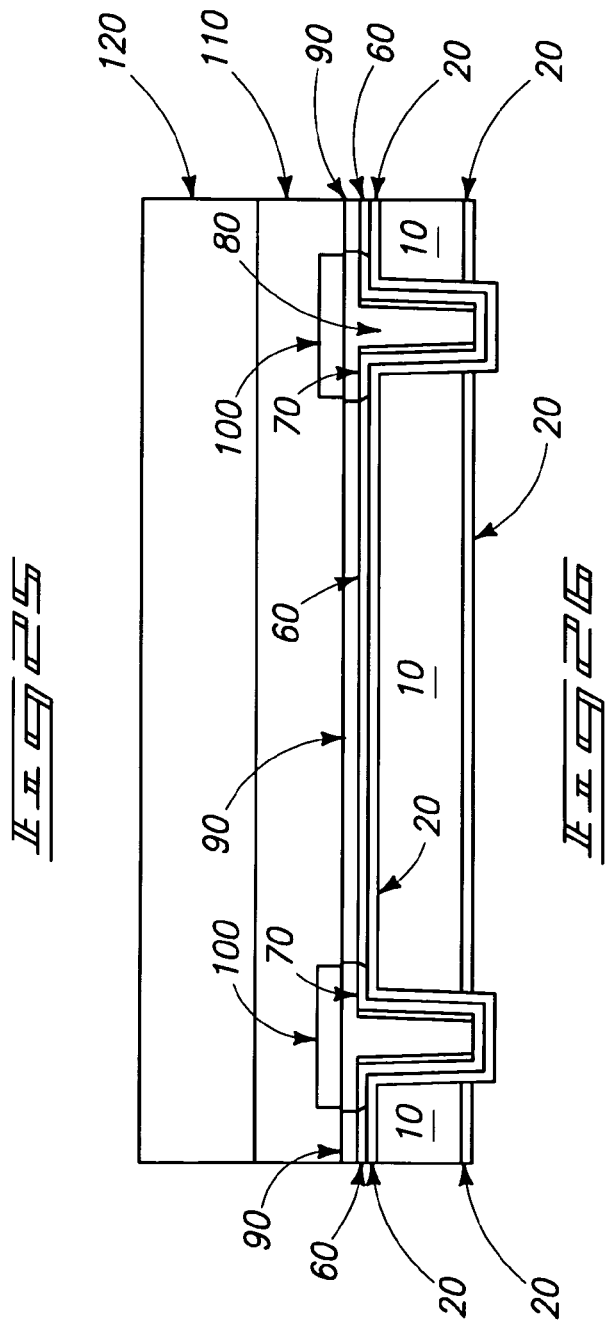

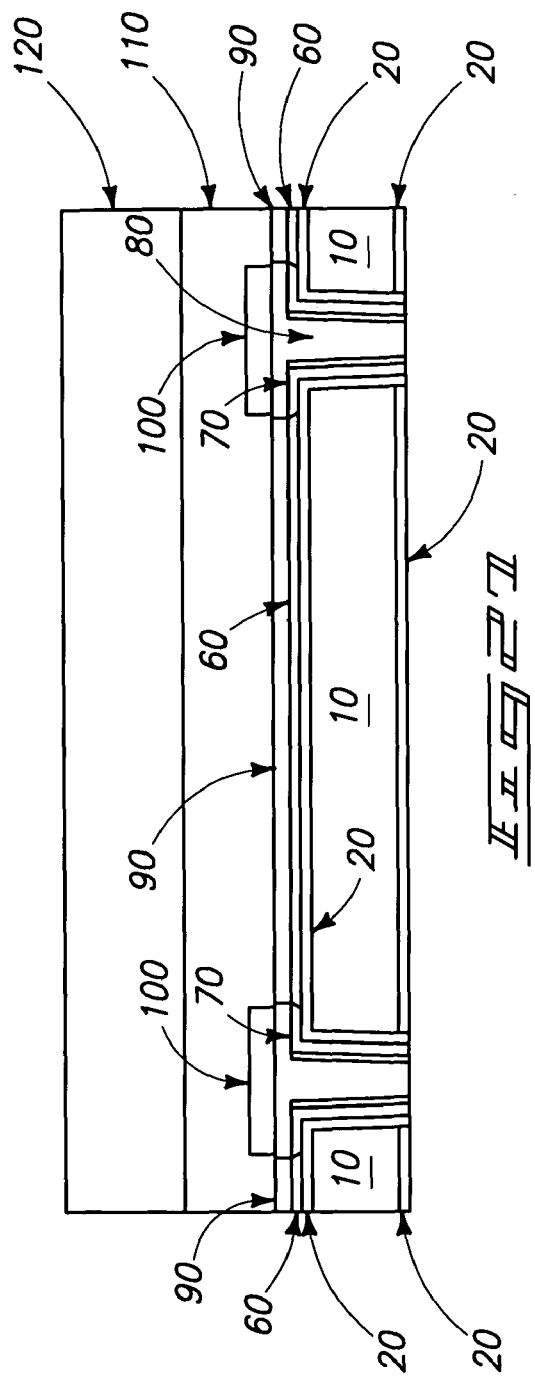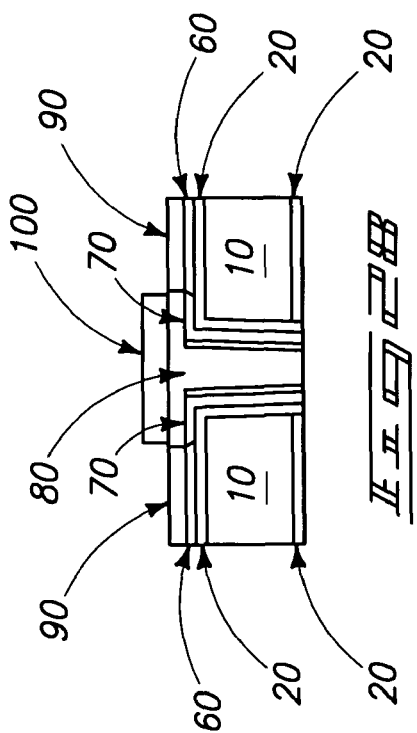

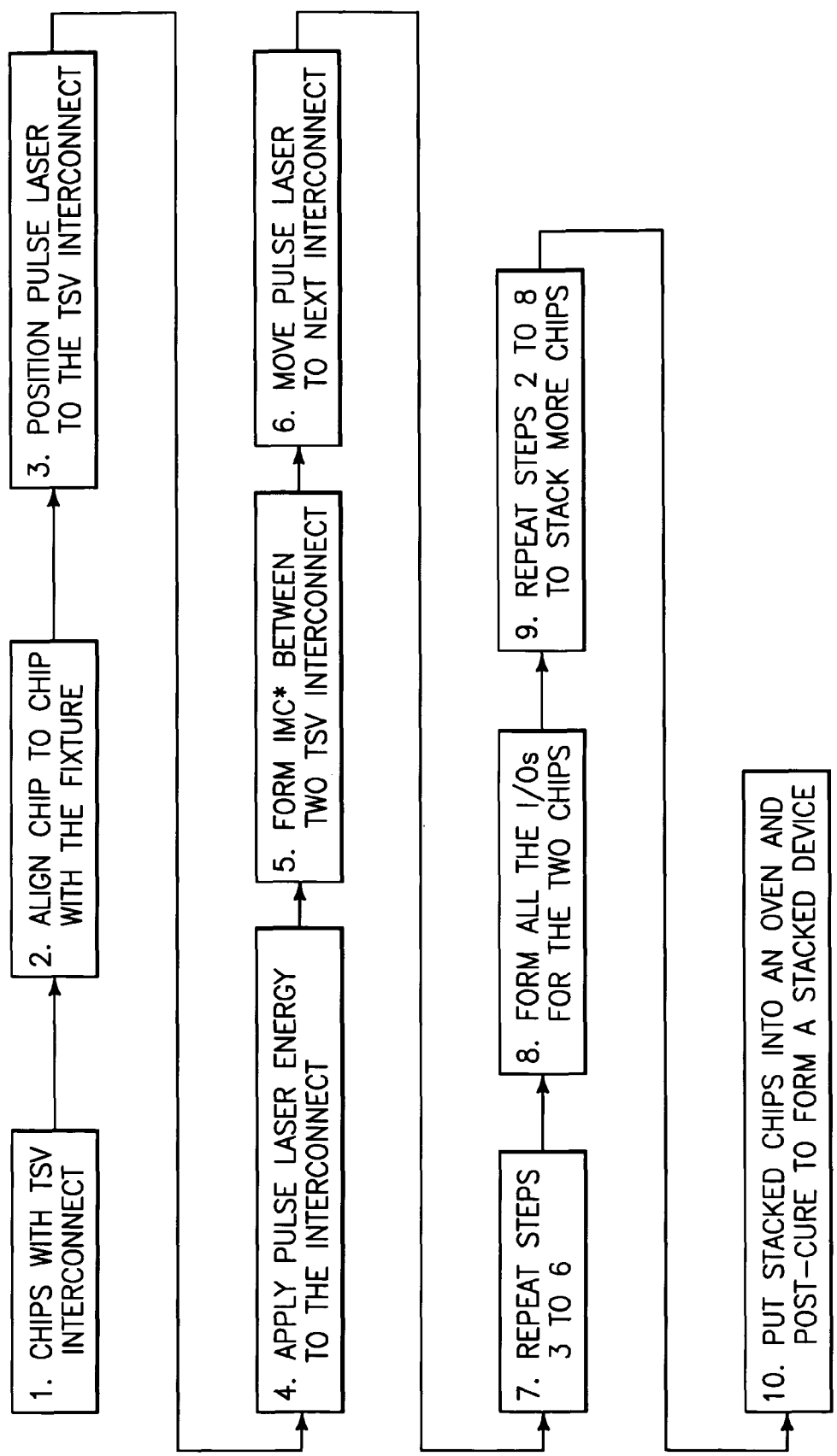

PULSE-LASER BONDING METHOD FOR THROUGH-SILICON-VIA BASED STACKING OF ELECTRONIC COMPONENTS

FIELD OF THE INVENTION

This invention relates to a pulse-laser based bonding method for through-silicon-via (TSV) based 3D die-stacking.

BACKGROUND OF THE INVENTION

With electronic devices, particularly portable devices such as mobile phones, becoming smaller and yet at the same time offering a wider range of functions, there is a need to integrate multifunctional chips but without increasing the size of the devices and keeping a small form factor. Increasing the number of electronic components in a 2D structure is incompatible with these objectives, and therefore 3D packages are increasingly being adopted in order to provide greater functionality and higher component density but with a small form factor.

In a 3D structure electronic components such as semiconductor chips may be provided in a multilayer stacked structure. To connect electrically the components in different layers through-silicon-via (TSV) technology may be used to provide the electrical interconnect and to provide mechanical support. In TSV technology a via is fabricated in a silicon chip and the via is filled with metal. Multiple components provided with such vias are then stacked and bonded together.

PRIOR ART

The bonding method is an important aspect of the fabrication of stacked electronic components. An ideal bonding method should be reliable and cost-effective. Traditionally wire bonding is used to establish electrical interconnect between chips, but wire-bonding requires greater in-plane size and is inconsistent with the objective of maximizing the component density. As an alternative to wire-bonding the use of TSV interconnects has been proposed, and methods including diffusion bonding, soldering and adhesive bonding can be used to bond wafers/chips with TSV interconnects.

In diffusion bonding a thin metal bonding layer (formed for example preferably from copper but also possibly tin, indium, gold, nickel, silver, palladium, palladium-nickel alloy or titanium) is applied to the respective surface of semiconductor components that are to be bonded. When the components are brought together under the correct conditions of temperature and pressure the two metal bonding layers diffuse into each other to form the bond. Diffusion bonding produces a good quality bond that is reliable, but disadvantages of this method include the requirement for very good coplanarity of the two semiconductor components and the need for a high bonding temperature. The method is therefore difficult to implement and is expensive. A typical example of a diffusion bonding method is shown in U.S. Pat. No. 7,157,787.

An example of a soldering method is shown in U.S. Pat. No. 6,577,013. In a soldering method solder is applied at the junctions of vias on semiconductor components to be stacked. Soldering does not require such high temperatures as diffusion bonding and can still produce a good reliable bond. However, soldering is not suitable as the number of components being stacked increases. With each new component being added to the stack the soldering process causes reflow of previously created solder joints that undermines their reliability.

Adhesive bonding is a low cost option in which an adhesive layer is provided on the surfaces to be bonded together. An example of adhesive bonding is shown in U.S. Pat. No. 6,593,645. However, while adhesive bonding is low cost and does not present significant manufacturing problems, it provides a low bonding strength, is not suitable for high current use and is unreliable.

SUMMARY OF THE INVENTION

According to the present invention there is provided a method of forming a through-silicon-via to form an interconnect between two stacked semiconductor components, comprising:
(a) forming a hole in each said component,
(b) filling each said hole with a plug formed of a first metal,
(c) stacking one said component on another said component such that said holes are in alignment, and
(d) applying a pulse of laser energy to form a bond between said metal plugs.

The first metal may be selected from the first metal is selected from Au, Cu, Sn, In, Ag, Ni, W and solders.

In preferred embodiments of the invention a second metal is provided between the plugs, and wherein upon application of the pulse of laser energy intermetallic compounds are formed at the junctions between the second metal and the plugs by diffusion bonding.

The second metal may be selected Sn, In, Cu, Au, Ag, Ni, W and solders.

Preferably an adhesion layer is provided between each plug and an inner surface of a respective hole. Preferably each hole is formed with an inner surface that diverges towards an opening in a surface of the component, for example at an angle of between 2° and 15°. The adhesion layer may comprise TiW, TiN, TaN, Cr or Ti.

Preferably an isolation layer is provided on the upper surface of each said component. The isolation layer is also preferably provided on the side wall of the via. The isolation layer may comprise $SiO_2$, SiN, polyimide, or benzocyclobutene. A polymer material may be provided between the components, for example polyimide, benzocyclobutene, epoxy, a non-conductive adhesive, or silicon rubber.

In preferred embodiments of the invention the laser energy pulse is between 1 and 70 J. The laser energy pulse may have a duration of between 1 μs and 20 ms, more preferably between 1 ms and 10 ms. Preferably the laser energy pulse is provided by a Nd:YAG laser operating at a wavelength of 1064 nm or other high-energy laser source.

According to another broad aspect the present invention also extends to a through-silicon-via structure interconnecting two semiconductor components wherein said structure comprises respective holes formed in said semiconductor components and with a first said component being located above a second said component such that the hole formed in the first said component overlies the hole formed in the second said component, each said hole being filled with a plug formed of a first metal, a second metal being provided between said plugs of a first metal, and intermetallic compounds being formed by diffusion bonding at the junctions of the first and second plugs of the first metal and said second metal.

BRIEF DESCRIPTION OF THE DRAWINGS

Some embodiments of the invention will now be described by way of example and with reference to the accompanying drawings, in which:

FIG. 1 is a sectional view through a via formed in accordance with an embodiment of the invention, FIG. 2 shows a plurality of stacked chips interconnected by vias as shown in FIG. 1, FIGS. 3 to 28 show sequentially the process steps involved in forming stacked chips connected by means of through-silicon-vias formed in accordance with an embodiment of the invention, and FIG. 29 shows the process flow of a method of a forming a multi-chip stacked device according to an embodiment of the invention.

DETAILED DESCRIPTION OF PREFERRED EMBODIMENTS

Figure 13:
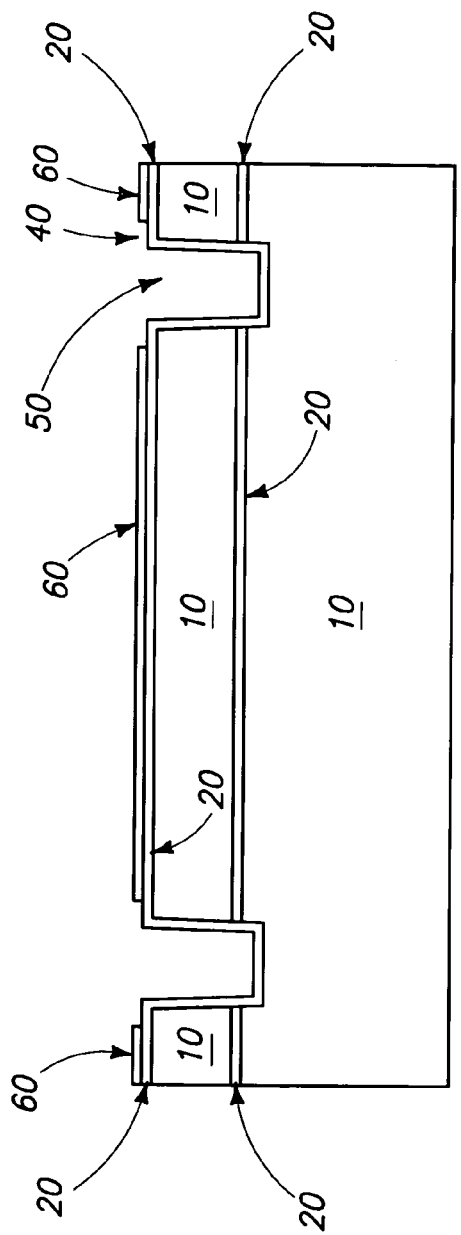

FIG. 1 shows a section through two silicon chips connected by means of through-silicon-vias formed in accordance with an embodiment of the invention. The via provides an electrical interconnection between two silicon chips 10. Each chip 10 is provided with an via hole 50 extending through the chip 10. The interior surface of each via hole is finished with an adhesion layer 70 (for example formed of TiW alloy, Cr, or Ti), and an isolation layer 20 (for example formed of $SiO_2$) that is also provided on the upper surface of each chip. The space between the two chips 10 is filled with a polymer bonding material 90. Suitable materials for the polymer material 90 include polyimide (PI), benzocyclobutene (BCB), epoxy, a non-conductive adhesive, or silicon rubber.

Each via hole through the chips 10 is filled with metal (e.g., copper, gold, tin, indium, silver, nickel, solders) to form a metal plug that adheres to the adhesion layer 70. Between the plugs that fill the respective via holes is provided a bonding metal 100 (e.g., tin, indium, copper, gold, silver, nickel, tungsten or solders), and the two metals are bonded forming intermetallic compounds (such as Sn/Cu, Au/Sn, Sn/In, Sn/Ag, Sn/Ni depending on the choice of metals). As will be seen from the remainder of this description, the intermetallic compounds are formed by diffusion bonding upon the application of a pulse of laser energy to the TSV. Also provided is a device protection layer 60 (e.g., $SiO_2/Si_3N_4/SiO_2$, PI, BCB)

FIG. 2 shows how multiple chips can be stacked. In FIG. 2 six chips 10 are shown stacked. The chips 10 are spaced apart by polymer materials 90. At each end of each chip 10 is provided at least one through-silicon-via 130 formed in accordance with the following description. The chips 10 are aligned using a chip alignment fixture 160 and the interconnects are formed by the application of pulsed laser energy shown schematically by laser source 150 and laser beam 140.

FIG. 3 shows a starting point for fabricating stacked chips in the form of a SOI wafer. The SOI wafer consists of three layers: a thin (about 100 µm) device layer 10, a thin (about 1.5 µm) layer 20 of $SiO_2$, and a thicker (approx 400 µm) Si layer as a holder. FIG. 4 shows a layer 20 of $SiO_2$ deposited on the wafer by plasma enhanced chemical vapour deposition to a thickness of 0.5 µm±500 Å. A layer of photoresist 30 is then printed on the $SiO_2$ layer 20 using a spinning method (FIG. 5) and patterned (FIG. 6) before a first etch of the $SiO_2$ layer 20 (FIG. 7) forms openings 40 in the $SiO_2$ layer 20. The photoresist layer is removed by chemical solution, a second photoresist printing 30 is applied to the $SiO_2$ layer 20 (FIG. 8), and is then patterned (FIG. 9) before the via openings 40 in the $SiO_2$ layer 20 are formed by deep reactive-ion etching (DRIE) (FIG. 10). This DRIE step is carried out at an angle from 2°-15° for 2 hours such that a hole is formed of which the interior surface diverges towards the opening at an angle from 2°-15°. This is advantageous because in the following step the inclined sides of the opening facilitate the uniform deposition of the adhesion layer.

Figure 14:
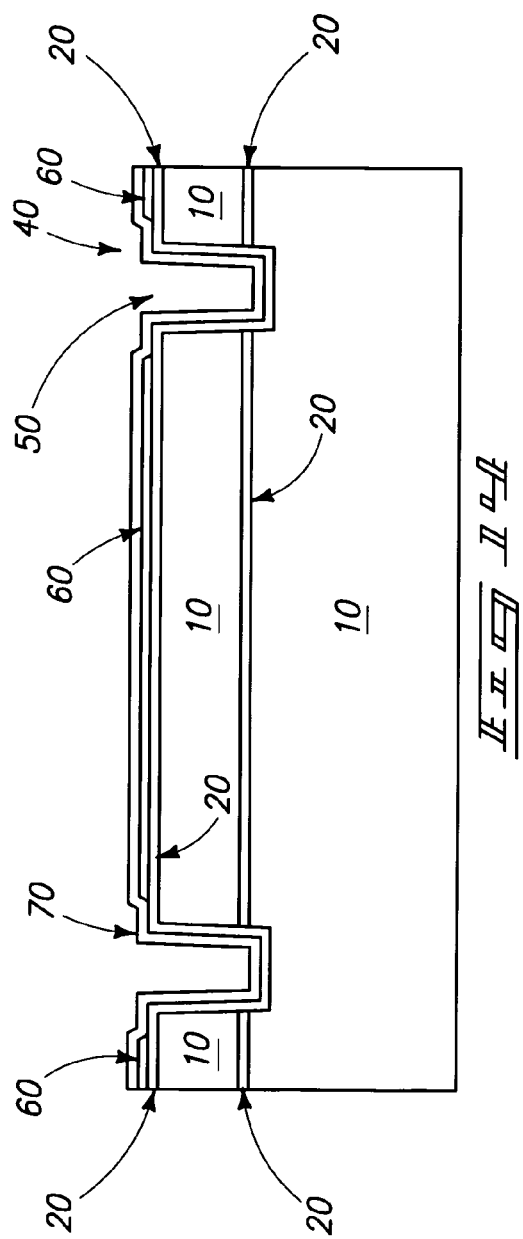

Residues generated by the deep reactive-ion etching are removed, and then the $SiO_2$ layer 20 at the bottom of the via holes 50 is etched away using reactive ion etching (FIG. 11). The via holes 50 are then etched deeper still using DRIE and the photoresist 30 is removed by chemical solution (FIG. 12). Thin layers 60 of $SiO_2/Si_3N_4/SiO_2$ (3000 Å/4000 Å/3000 Å) are then prepared onto the surface using plasma enhanced chemical vapour deposition (PECVD) techniques (FIG. 13), and then layers 70 of Ti/W (approx 0.1 µm to 0.2 µm) are prepared on the surface by a sputtering method (FIG. 14). A thin (0.5 µm) layer of $SiO_2$ is then deposited onto the surface using PECVD (FIG. 15), and then a maskless etch is used to etch the top layer of $SiO_2$ away while leaving the $SiO_2$ layer remaining on the sidewall of the via hole 50 (FIG. 16). This remaining $SiO_2$ layer facilitates the filling of the hole with metal from the bottom up to avoid partial filling.

A thin layer 30 of photoresist is then prepared on the surface and the via/interconnect openings are patterned using photolithography (FIG. 17), the bottom of the via hole is plated by metal 80, e.g., copper, by sputtering method (FIG. 18), the holes are then filled with the same metal 80 by electroplating (FIG. 19), followed by polishing (FIG. 20). The photoresist layer is then removed (FIG. 20), and the Ti and W layers are removed by wet etching (FIG. 21). A layer of polymer 90 (e.g., PI, BCB, epoxy, NCA or silicon rubber) is prepared on the surface, procured and patterned using photolithography (FIG. 22). A layer of tin 100 is then deposited on the Cu interconnect by electroplating or sputtering (FIG. 23). The wafer is then bonded to a glass holder 120 using a layer of adhesive 110 (FIG. 24). The Si wafer is then thinned by grinding and chemical mechanical polishing (CMP) to a certain thickness (FIG. 25), and is then further thinned by RIE until the $SiO_2$ layer 20 is reached (FIG. 26). The remaining layers of $SiO_2$, Ti and W are then etched away to expose the metal-filled via hole (FIG. 27). The wafer may then be diced and the glass holder 120 removed to obtain individual silicon chips (FIG. 28). Two or more silicon chips may then be stacked such that respective partially formed through-silicon-via interconnect 130 overlie and contact each other.

After two chips are stacked together such that the through-silicon-via interconnects are on top of each other, a pulse laser is then used to bond the chips together at the through-silicon-via interconnects as shown in FIG. 2. A pulse laser e.g. a Nd:YAG laser is used to heat each through-silicon-via individually so that the intermetallic compound (FIG. 1) is formed by diffusion bonding and which joins the metal plugs together through the intermediate metal.

Typically, the pulse may be applied for between 1 µs to 20 ms with a pulse energy of from 1 J to 70 J, for example a pulse duration of about 1 ms with a pulse energy of 3 J and a beam diameter of 20 µm may be suitable using a Nd:YAG laser at 1064 nm. The dimensions of the through-silicon-via may be in the range of a diameter of 20 µm to 200 µm and a thickness of 25µ to 100 µm.

An advantage of using pulse laser bonding is that the size of the laser beam can be controlled to match the size of the via. This avoids the risk of damage to the chip and any components on the chip that might occur by unnecessarily heating a larger area of the chip. The temperature is concentrated on the via being bonded, and other vias both laterally displaced and also vias in the same stack beneath the bond being formed, do not experience detrimentally high temperatures.

FIG. 29 is a flowchart illustrating a process flow for forming a plurality of stacked chips using a method according to an embodiment of the invention. In step 1 a plurality of chips are provided with metal bumps where TSV interconnects are to be formed. In step 2, at least two chips are aligned using a fixture to control the alignment. In step 3 a pulse laser is positioned above a location where a TSV interconnect is to be formed, and in step 4 a pulse of laser energy is applied to the interconnect, which as shown in step 5 is sufficient to form the intermetallic compound and the bonding between the two chips. The laser is then moved to the next interconnect (step 6) and steps 3 to 6 are then repeated until all interconnects are completed and all input/output connections are completed for two chips (step 8). Steps 2 to 8 are then repeated with a further chip added to the stack and this may be repeated until all chips are stacked. The stacked chips may be placed in an oven for a post-cure step (step 10). Typically the bonding time required for each individual bond may be only 1 ms and the total cycle time less than 100 ms.

At least in preferred embodiments the present invention provides a method of forming through-silicon-vias that is advantageous because it provides a very good bond quality but requires only medium temperatures. Furthermore the bonding temperature can be limited in space to the region of the bond reducing the possibility of thermal stress or damage to other components during the bonding process. The method allows many chips to be stacked and enables a simple and reliable manufacturing process with a very high throughput and only medium cost.

The invention claimed is:

1. A method of forming a through-silicon-via to form an interconnect between two stacked semiconductor components, comprising:
    (a) forming a hole in each said component,
    (b) forming an isolation layer, an adhesion layer, and a $SiO_2$ layer in said hole, wherein the $SiO_2$ layer is removed from the bottom of said hole,
    (c) filling each said hole with a plug formed of a first metal such that said metal plug is level with the bottom surface of the respective said component,
    (d) stacking one said component on another said component such that said holes are in alignment, and
    (e) applying a pulse of laser energy at said holes to form a bond between said metal plugs.

2. A method as claimed in claim 1 wherein a second metal is provided between said plugs, and wherein upon application of said pulse of laser energy intermetallic compounds are formed at the junctions between said metal and said plugs by diffusion bonding.

3. A method as claimed in claim 1 wherein the forming an adhesion layer comprises forming the adhesion layer between each said plug and an inner surface of a respective hole.

4. A method as claimed in claim 3 wherein a said hole is formed with an inner surface that diverges towards an opening in a surface of the component.

5. A method as claimed in claim 4 wherein said inner surface diverges at an angle of between 2° and 15°.

6. A method as claimed in claim 3 wherein said adhesion layer comprises TiW, TiN, TaN, Cr or Ti.

7. A method as claimed in claim 1 further comprising providing an isolation layer on the upper surface of each said component and the inner wall of the via hole.

8. A method as claimed in claim 7 wherein said isolation layer comprises $SiO_2$, SiN, polyimide, or benzocyclobutene.

9. A method as claimed in claim 1 further comprising providing a polymer material between said components.

10. A method as claimed in claim 9 wherein said polymer material comprises polyimide, benzocyclobutene, epoxy, a non-conductive adhesive, or silicon rubber.

11. A method as claimed in claim 1 wherein the power of said laser energy is between 1 and 70J.

12. A method as claimed in claim 1 wherein the laser energy pulse has a duration of between 1µs and 20ms.

13. A method as claimed in claim 12 wherein the laser energy pulse has a duration of between 1ms and 10ms.

14. A method as claimed in claim 1 wherein the laser energy pulse is provided by a Nd:YAG laser operating at a wavelength of 1064nm.

15. A method as claimed in claim 1 wherein the first metal is selected from Au, Cu, Sn, In, Ag, Ni, W and solders.

16. A method as claimed in claim 2 wherein the second metal is selected from Sn, In, Cu, Au, Ag, Ni, W and solders.

17. A method as claimed in claim 1 wherein prior to filling said hole with metal, the bottom of said hole is provided with the layer of $SiO_2$ that is subsequently removed after filling.

18. A through-silicon-via interconnect structure between and interconnecting two stacked semiconductor components wherein said structure comprises respective holes formed in said semiconductor components and with a first said component being stacked on and located above a second said component such that the hole formed in the first said component overlies the hole formed in the second said component and which said holes of said first and second said components are in alignment, each said hole including an isolation layer, an adhesion layer, and a SiO2 layer, and being filled with a plug formed of a first metal such that said metal plug is level with the bottom surface of the respective said component and wherein the SiO2 layer is removed from the bottom of said hole, a second metal being provided between said metal plugs of said first metal, and a bond between said metal plugs and including intermetallic compounds formed by diffusion bonding at the junctions of the metal plugs of the first metal and said second metal using a pulse of laser energy applied at said holes.

19. A through-silicon-via interconnect structure as claimed in claim 18 wherein the inner surfaces of said holes are provided with the adhesion layer.

20. A through-silicon-via interconnect structure as claimed in claim 19 wherein the adhesion layer is formed of TiW, TiN, TaN, Cr or Ti.

21. A through-silicon-via interconnect structure as claimed in claim 19 wherein the inner surfaces of said holes diverge outwardly towards an opening formed in an upper surface of the respective component in which the hole is formed.

22. A through-silicon-via interconnect structure as claimed in claim 21 wherein the inner surfaces diverge at between 2° to 15°.

23. A through-silicon-via interconnect structure as claimed in claim 18 wherein an upper surface of at least the second component is provided with an isolation layer.

24. A through-silicon-via interconnect structure as claimed in claim 23 wherein the isolation layer upon the upper surface of at least the second component is formed of $SiO_2$, SiN, polyimide, or benzocyclobutene.

25. A through-silicon-via interconnect structure as claimed in claim 18 wherein a polymer material is provided between the two components.

26. A through-silicon-via interconnect structure as claimed in claim 25 wherein the polymer material comprises polyimide, benzocyclobytene, epoxy, a non-conductive adhesive, or silicon rubber.

* * * * *